(12) United States Patent
Sundareswaran et al.

(10) Patent No.: US 8,656,331 B1
(45) Date of Patent: Feb. 18, 2014

(54) TIMING MARGINS FOR ON-CHIP VARIATIONS FROM SENSITIVITY DATA

(71) Applicants: Savithri Sundareswaran, Austin, TX (US); Surya Veeraraghavan, Austin, TX (US)

(72) Inventors: Savithri Sundareswaran, Austin, TX (US); Surya Veeraraghavan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/767,064

(22) Filed: Feb. 14, 2013

(51) Int. Cl.
*G06F 17/50* (2006.01)

(52) U.S. Cl.
USPC .......................................................... 716/113

(58) Field of Classification Search
USPC .......................................................... 716/113
See application file for complete search history.

(56) References Cited

U.S. PATENT DOCUMENTS

| | | | | |
|---|---|---|---|---|
| 5,274,568 | A * | 12/1993 | Blinne et al. .................. | 716/108 |
| 5,692,160 | A * | 11/1997 | Sarin ............................... | 703/23 |
| 7,010,475 | B2 * | 3/2006 | Ehrler ............................. | 703/15 |
| 7,222,319 | B2 * | 5/2007 | Yonezawa ...................... | 716/108 |
| 8,117,575 | B2 * | 2/2012 | Lu et al. ......................... | 716/106 |
| 8,122,409 | B2 | 2/2012 | Lackey et al. .................. | 716/113 |
| 8,516,424 | B2 * | 8/2013 | Tetelbaum et al. ........... | 716/113 |

OTHER PUBLICATIONS

Katz et al., "What is stage-based AOCV," CLK Design Automation, Jul. 2011, 14 pages.
"PrimeTime Advanced OCV Technology," Synopsys, Inc., White Paper, Apr. 2009, 9 pages.

* cited by examiner

*Primary Examiner* — Jack Chiang
*Assistant Examiner* — Brandon Bowers
(74) *Attorney, Agent, or Firm* — VanLeeuwen & VanLeeuwen; David Dolezal

(57) ABSTRACT

An approach is provided in which a system executes transistor-level circuit simulation of a standard cell that includes parameters corresponding to a semiconductor manufacturing technology process. Sensitivity data is collected that quantifies changes to performance metrics corresponding to the standard cell in response to adjusting one or more of the parameters during the transistor-level circuit simulation. In turn, the system generates derate factors based upon the sensitivity data and tests an integrated circuit design according to the derate factors. Testing the integrated circuit design includes performing static timing analysis on the integrated circuit design that simulates operation of a device built from the integrated circuit design using the semiconductor technology process. In one embodiment, when the static timing analysis indicates timing violations, the system dynamically generates custom derate factors for particular cell instances corresponding to the timing violations. In turn, subsequent timing analysis is performed using the custom derate factors.

20 Claims, 8 Drawing Sheets

Sensitivity Table 135

```
cell (<cellName>) {
  ...
  pin(<output>) {                                              ← 300
  ...
  timing () {
  ...
  ecsm_timing_sensitivity () {
      ecsm_parameter_type : Ptyp30V099T165_x_dev;
      ecsm_parameter_order : Ptyp30V099T165_x_dev;             ← 305
      cell_rise ( ier_4_x_cl_6_delay ) {
          index_1("0.00504956, 0.0752652, 0.300425, 1.20628");      ← Input Slews 310
          index_2("0.00047572, 0.011001, 0.021527, 0.042578, 0.08468, 0.337292");   ← Output Loads 320
          values( \
             "0.00410123, 0.005236, 0.00558569, 0.00621721, 0.0080127, 0.0231465", \
             "0.00667526, 0.00760119, 0.00789421, 0.00837322, 0.0097942, 0.0238526", \
             "0.0185686, 0.0192101, 0.0194969, 0.0197704, 0.0204236, 0.0299972", \
             "0.059526, 0.0601181, 0.060576, 0.0610215, 0.0611213, 0.0647587" \
          );                                                   ← Arc Sensitivity Values 230
      }
}
```

FIG. 3

| CELL NAME | AVG CELL R% | AVG CELL F% | RANGE R% | RANGE F% | MAX CELL R% | MAX CELL F% | MIN CELL R% | MIN CELL F% |
|---|---|---|---|---|---|---|---|---|
| BUFF 1 | 4.634 | 3.084 | 7.751 | 2.471 | 9.633 | 4.768 | 1.882 | 2.296 |
| BUFF 2 | 3.012 | 2.009 | 5.02 | 1.829 | 6.34 | 3.29 | 1.32 | 1.46 |
| BUFF 3 | 2.486 | 1.672 | 4.482 | 1.547 | 5.492 | 2.756 | 1.011 | 1.208 |
| BUFF 4 | 2.057 | 1.35 | 3.872 | 1.253 | 4.704 | 2.234 | 0.832 | 0.981 |
| BUFF 5 | 1.298 | 0.863 | 2.521 | 0.826 | 3.037 | 1.45 | 0.516 | 0.624 |

FIG. 7

TIMING MARGINS FOR ON-CHIP VARIATIONS FROM SENSITIVITY DATA

TECHNICAL FIELD

The present disclosure relates to generating on-chip timing margins based upon sensitivity data collected during standard cell characterization. More particularly, the present disclosure relates to dynamically generating accurate and customized advanced on-chip variation (AOCV) derate factors for use with static timing analysis on an integrated circuit.

BACKGROUND

Integrated circuit wafer fabrication facilities adhere to strict standards in each stage of producing integrated circuits as wafer technologies become more advanced. Even with the strict standards, slight variations occur between wafer lots, wafers within a lot, dies within a wafer, and even transistors within a die. These on-chip variations (OCV) may be caused by variations in impurity concentration densities, oxide thicknesses, diffusion depths, voltage, temperature, etc.

When an integrated circuit designer does not budget enough timing margin for these "on chip" variations, production yield is reduced due to functional failures and/or timing failures. Static timing analysis is typically performed during an integrated circuit's "design synthesis" phase that checks whether all "paths" within the design meet stated timing criteria. In many cases, static timing analysis is conservative in the sense that it over-estimates the delay of long paths in the circuit and under-estimates the delay of short paths in the circuit. However, in many cases due to performance requirements, the integrated circuit designer is not able to allow an increased amount of timing margin in an integrated circuit.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein:

FIG. 3 is a diagram showing an example of a sensitivity table;

FIG. 7 is a diagram showing various derate factors based upon load and slew conditions.

DETAILED DESCRIPTION

This disclosure provides a method for improving the accuracy of an integrated circuit design's static timing analysis by utilizing on-chip variation (OCV) derate factors derived from sensitivity data collected during standard cell characterization (transistor-level circuit simulation). When a timing condition occurs at a particular standard cell instance, customized derate factors are dynamically generated based upon the standard cell instance's actual input slew and output load conditions.

As those skilled in the art can appreciate, a derate factor is a quantity that is used during timing analysis to increase (or reduce) a cell's delay to account for specific design or manufacturing effects. For slow or worst-case timing analysis, the timing derate factor is added to a cell's delay, thereby increasing the cell's effective delay. For fast or best-case timing analysis, the derate factor is subtracted to the cell's delay, thereby reducing cell's effective delay.

Figure 1:
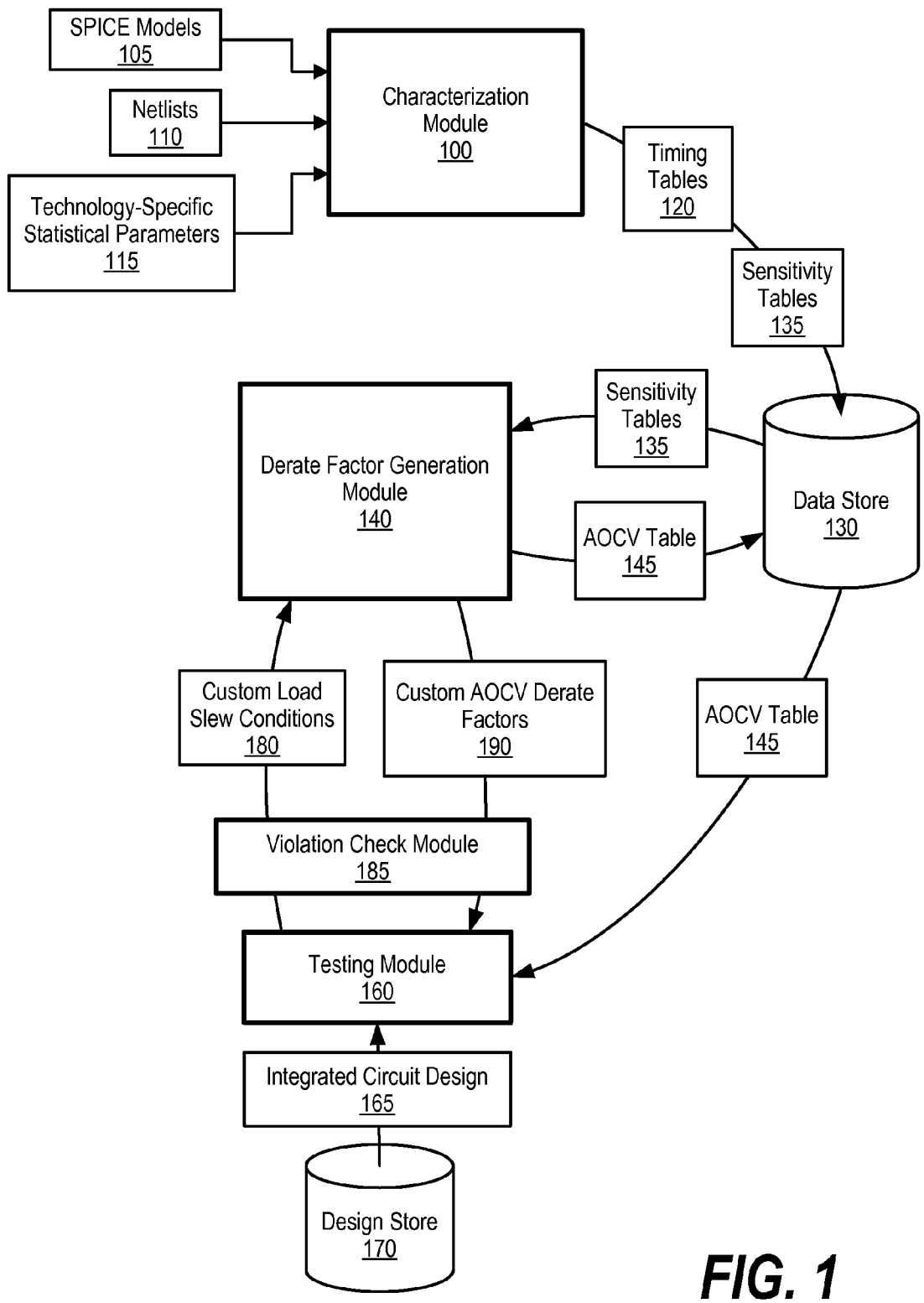
FIG. 1 is a diagram showing a derate factor generation module using sensitivity data to create customized AOCV (advanced on-chip variation) derate factors, which are utilized by a design synthesis module to perform static timing analysis on an integrated circuit.

FIG. 1 is a diagram of a system having a derate factor generation module using sensitivity data to create AOCV (advanced on-chip variation) derate factors, which are utilized by a design synthesis module to perform static timing analysis on an integrated circuit.

As will be discussed more fully below, characterization module 100 uses SPICE models 105, netlists 110, and technology-specific statistical parameters 115 to perform transistor-level circuit simulation and generate timing tables 120 and sensitivity tables 135. SPICE (Simulation Program with Integrated Circuit Emphasis) models 105 include transistor and interconnect models. As those skilled in the art can appreciate, other types of models that describe transistor characteristics and interconnections between transistors may be used for transistor-level circuit simulation, such as SPEF (Standard Parasitics Exchange Format), DSPF (Detailed Standard Parasitic Format), and etcetera. Netlists 110 capture the function of a specific standard cell through transistor connectivity information and may include parasitics (e.g., resistance and capacitance).

Technology-specific statistical parameters 115 include a particular semiconductor manufacturing technology's random variation parameters. In one embodiment, semiconductor manufacturing technology process disturbances are accounted for by two basic parameter types, which are global variation parameters and random variation parameters. Global variation parameters pertain to process disturbances effecting each transistor on a chip in a similar manner (globally), whereas random variation parameters pertain to process disturbances affecting various transistors on a chip in different manners (random on-chip variations). A processing fab identifies a most critical set of parameters impacting transistor behavior and classifies each critical parameter as a global variation parameter or a random variation parameter. Since the random variation parameters have significant impact on a chip's timing margins relative to the global variation parameters, the random variation parameters are included in technology-specific statistical parameters 115.

Each standard cell is characterized using a transistor level circuit simulator (e.g., SPICE simulator). The statistical parameter variations are often smaller than the standard cell's nominal values. Using a Taylor series expansion, for example, performance metrics (e.g., delay) of the cells may be considered as almost linear functions of the parameters. As described herein, sensitivity analysis is a method of making a small change in a random variation parameter and observing a change in cell's performance metrics (described herein as sensitivity data). For sensitivity characterization, each technology specific statistical parameter for every device/transistor in the cell is perturbed and a deviation in the performance metric (e.g., delay, output transition time, etc.) is derived. Such sensitivity characterization is performed for each timing arc in a standard cell. As those skilled in the art can appreciate, a timing arc corresponds to a signal propagation path from one of the standard cell's input pins to one of the standard cell's output pins (e.g., rising edge propagation from "input 1" to "output 1." Characterization module 100, in one embodiment, may be a software program executing on a processor, such as processor 810 shown in FIG. 8.

In one embodiment, characterization module 100 generates timing tables 120 and sensitivity tables 135 in a liberty timing file format (.lib), which are stored in data store 130. Sensitivity tables 135 include arc sensitivity values computed from sensitivity data that is generated during the sensitivity analysis. As discussed below, since the arc sensitivity values are computed from the sensitivity data, derate factor generation module 140 generates accurate derate factors compared with generating derate factors though other mechanisms (e.g., Monte Carlo simulations, equivalent circuit analysis, etc.).

FIG. 3 shows an example of sensitivity table 135, which includes arc sensitivity values for various load slew combinations. As one skilled in the art can appreciate, input slew relates to an input transition time that a given cell (e.g., NAND gate) transitions from one value to another value (e.g., 0 to 1). Likewise, output load relates to the equivalent load on the given cell's output, which is typically dictated by the interconnect parasitics driven by the cell.

Figure 4:
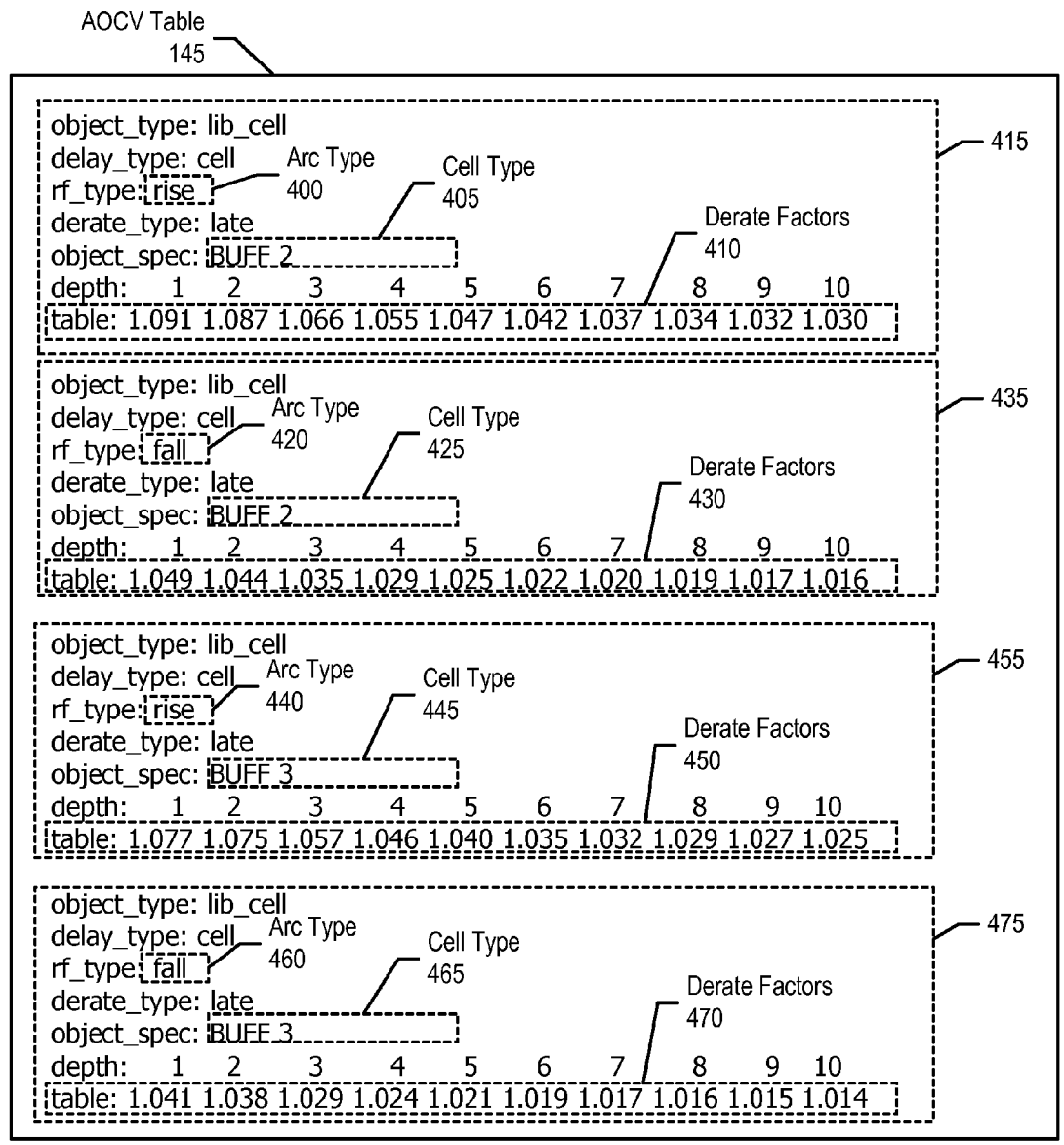
FIG. 4 is a diagram showing an example of an AOCV table.

Derate factor generation module 140 retrieves sensitivity tables 135 and creates AOCV table 145 based upon default input slew conditions and output load conditions specified by a user. AOCV table 140 includes derate factors for various timing arcs and various depths (e.g., the number of standard cells connected to each other). FIG. 4 shows an example of AOCV table 145, which includes derate factors for rising arcs and falling arcs for two different standard cells. Derate factor generation module 140, in one embodiment, may be a software program executing on a processor, such as processor 810 shown in FIG. 8.

Testing module 160 retrieves integrated circuit design 165 (e.g., in a gate-level netlist format) from design store 170 and commences logic synthesis and static timing analysis. As those skilled in the art can appreciate, testing module 160 may be included in a suite of EDA software tools.

During static timing analysis, testing module 160 retrieves AOCV table 145 and uses its "default" derate factors to perform static timing analysis on the integrated circuit. When violation-check module 185 detects a timing violation during the static timing analysis, testing module 160 identifies a cell instance (e.g., NAND gate) corresponding to the timing violation and sends custom load slew combinations 180 corresponding to the cell instance to derate factor generation module 140. Custom load-slew combinations 180 include specific input slew and output load conditions experienced by the cell instance.

In turn, derate factor generation module 140 uses sensitivity tables 135 to dynamically create custom AOCV derate factors 190, which are specific to the cell instance's input slew and output load. In one embodiment, custom AOCV derate factors 190 may be "packaged" in an updated AOCV table.

Figure 6:
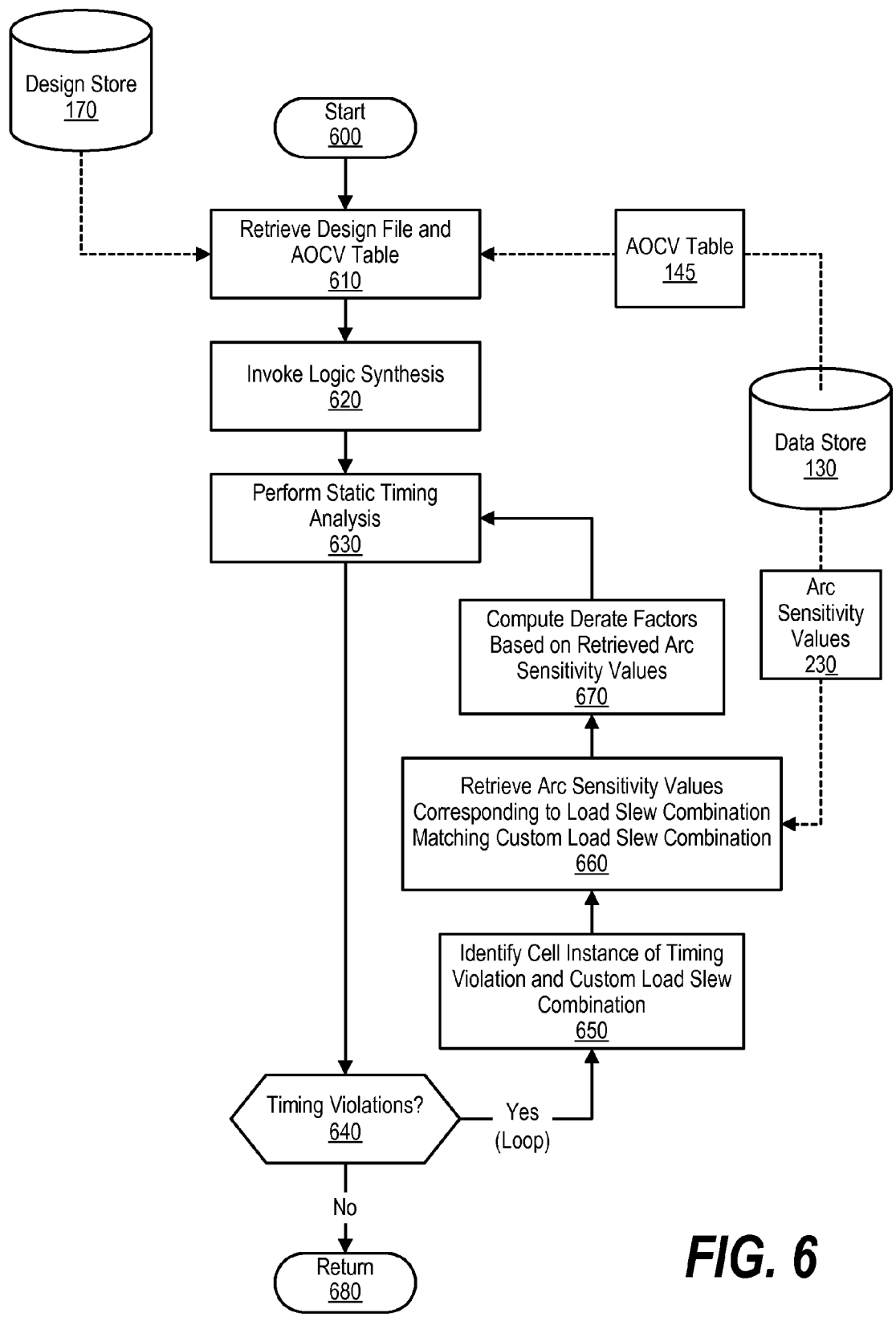
FIG. 6 is a flowchart showing steps taken in dynamically generating custom derate factors during logic synthesis.

Testing module 160 re-synthesizes integrated circuit design 165 and performs static timing analysis using the custom derate factors and, in one embodiment, uses the default derate factors to simulate a first cell instance of a standard cell and uses the custom derate factors to simulate a second cell instance of the same standard cell (see FIG. 6 and corresponding text for further details).

Figure 2:
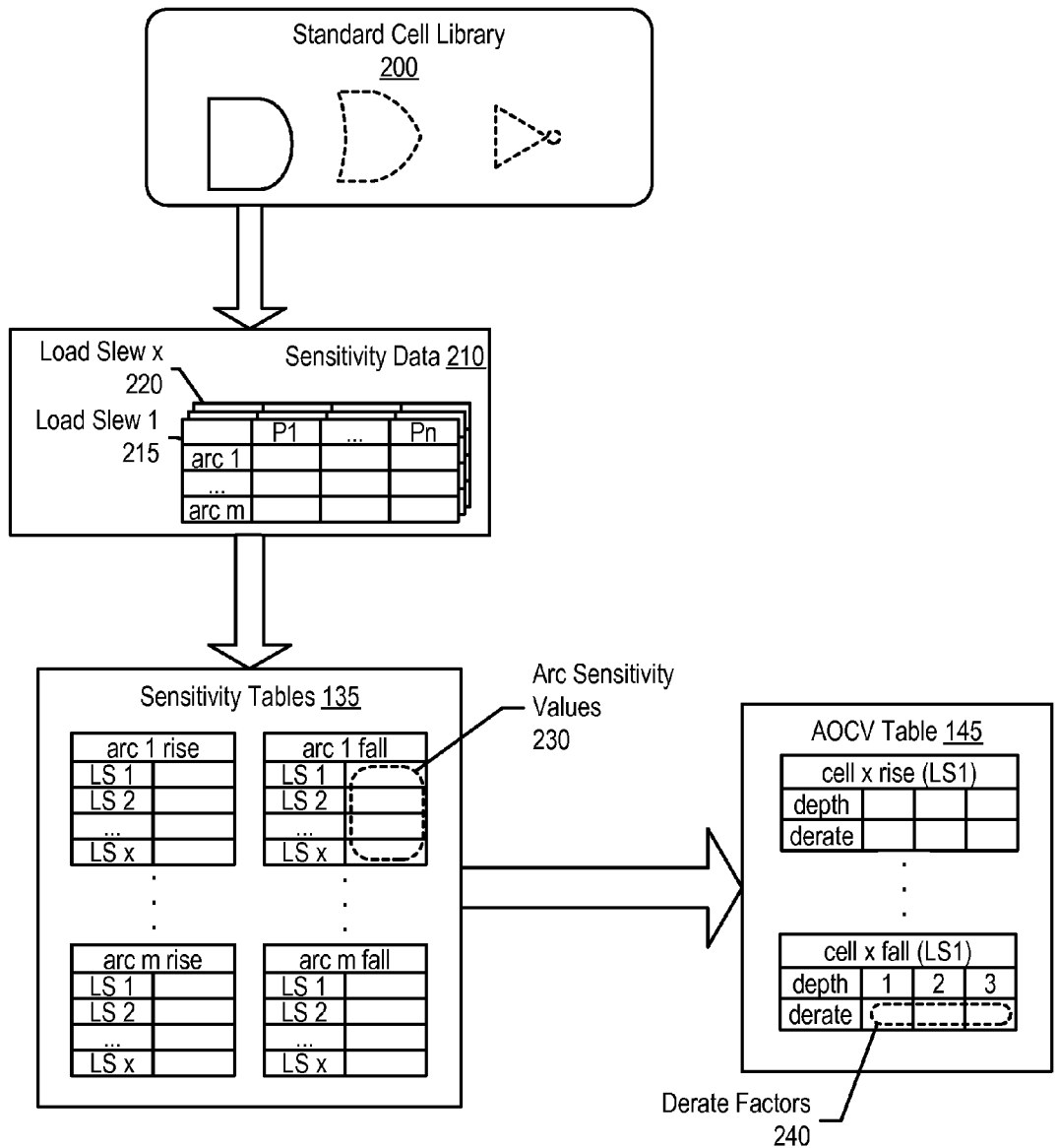
FIG. 2 is a diagram showing an example of various stages of transforming sensitivity data to AOCV derate factors.

FIG. 2 is a diagram illustrating various stages of transforming sensitivity data to AOCV derate factors. Standard cell library 200 includes standard cells such as AND gates, OR gates, inverters, etc. During standard cell characterization, sensitivity data is generated (sensitivity data 210) based upon technology-specific statistical parameters. For each standard cell, the sensitivity data is generated for each timing arc (rising, falling, input, output), with respect to each transistor parameter ($V_t$ (threshold voltage), etc.) and for each input slew and output load combination (load-slew 1 215 through load-slew x 220). FIG. 2 displays sensitivity data 210 as a group of tables for simplicity purposes. As those skilled in the art can appreciate, sensitivity data 210 may be in a format different than what is shown in FIG. 2 (e.g., a text file).

In one embodiment, characterization module 100 performs a transistor level SPICE simulation of a standard cell in order to determine the sensitivity of a cell's performance metrics (e.g., delay, output transition time, etc.) with respect to each technology specific statistical parameter 115. Typically, a technology-specific statistical parameter is modeled as a normal distribution, N(0, 1). Characterization module 100 assigns a specific value from normal distribution of statistical/random parameter to each device/transistor in the cell (e.g., "perturbation"). Characterization module 100 then computes the delay deviation due to each such perturbation. This is repeated for every technology specific statistical parameter and also for each rise and fall timing arc of the standard cell. For example, assuming the delay deviation for a given timing arc is $\Delta D_{mn}$ for an m-th transistor in cell, and n-th statistical parameter, the sensitivity for a given arc, $\Delta D$, is computed as:

$$\Delta D = \sqrt{\sum_m \sum_n [\Delta D]^2}$$

for several input slew and output load combinations.

In one embodiment, as shown in FIG. 2, sensitivity tables 135 may include tables on a per timing arc basis (input rising arc, input falling arc, etc.). In this embodiment, each of sensitivity tables 135 may include arc sensitivity values for multiple load-slew combinations (arc sensitivity values 210). In one embodiment, sensitivity tables 135 are written in a generic format and may include other information such as delay sensitivity, output transition time sensitivity, etc.

Derate factor generation module 140 uses sensitivity tables 135 to generate AOCV table 145 according to a particular default output load and input slew combinations specified by a user. As such, derate factor generation module 140 extracts arc sensitivity values corresponding to the default output load and input slew combination (e.g., load-slew combination "2") to generate AOCV table 145. In one embodiment, delay derate factor generation module 140 uses a formula such as the following to compute the derate factors from the arc sensitivity values:

$$\Delta D = \sqrt{\frac{1}{N} \cdot \sum_{r=1}^{N} \{[\Delta D_i^r]^2 + [c_r \cdot \Delta S_{i-1}^r]^2\}}$$

where $\Delta D_i^r$ is delay sensitivity for r-th timing arc and i-th depth; $\Delta S_{i-1}^r$ is transition time sensitivity from previous depth, i−1, and for r-th timing arc of the cell; and, $c_r$ is the sensitivity of delay with respect to input slew/transition time. N represents the number of timing arcs for a cell. The above computation is repeated for each rising arc separately and each falling arc separately.

Testing module 160 uses AOCV table 145 during static timing analysis. When the static timing analysis generates a timing violation, violation-check module 185 requests custom derate factor based upon a cell instance's custom input slew and output load combination. As such, derate factor generation module 140 extracts arc sensitivity values corresponding to the cell instance's load-slew combination and dynamically generates custom derate factors that testing module 160 utilizes in a subsequent static timing analysis (see FIG. 6 and corresponding text for further details).

FIG. 3 is a diagram showing an example of a sensitivity table. Sensitivity table 135 includes arc sensitivity values (arc sensitivity values 230) that correspond to various load-slew combinations. Lines 300 and 305 indicate that sensitivity table 135 corresponds to a rising timing arc of an output. Input slews 310 include four values, and output loads 320 include six values. As such, arc sensitivity values 230 include 24 values, one for each load-slew combination (6×4=24).

FIG. 4 is a diagram showing an example of an AOCV table. AOCV table 145 includes different derate factors for various depths. As those skilled in the art can appreciate, the "depth" corresponds to a "chain" of cells within an integrated circuit.

Block 415 includes derate factors 410 for a rising arc (arc type 400) on a "BUFF2" cell (cell type 405). As can be seen, derate factors 410 include derate factors for depths from 1 to 10. Block 435 includes derate factors 430 for a falling arc (arc type 420) on the "BUFF2" cell (cell type 425). Again, derate factors 430 include derate factors for depths from 1 to 10. As one skilled in the art can appreciate, AOCV table 145 may include more or less derate factors than what is shown in FIG. 4.

Blocks 455 and 475 include information pertaining to a different type of cell, which is "BUFF3" (cell type 445, 465). Block 455 includes derate factors 450 for a rising arc (arc type 440) and block 475 includes derate factors 470 for a falling arc (arc type 460).

Figure 5:
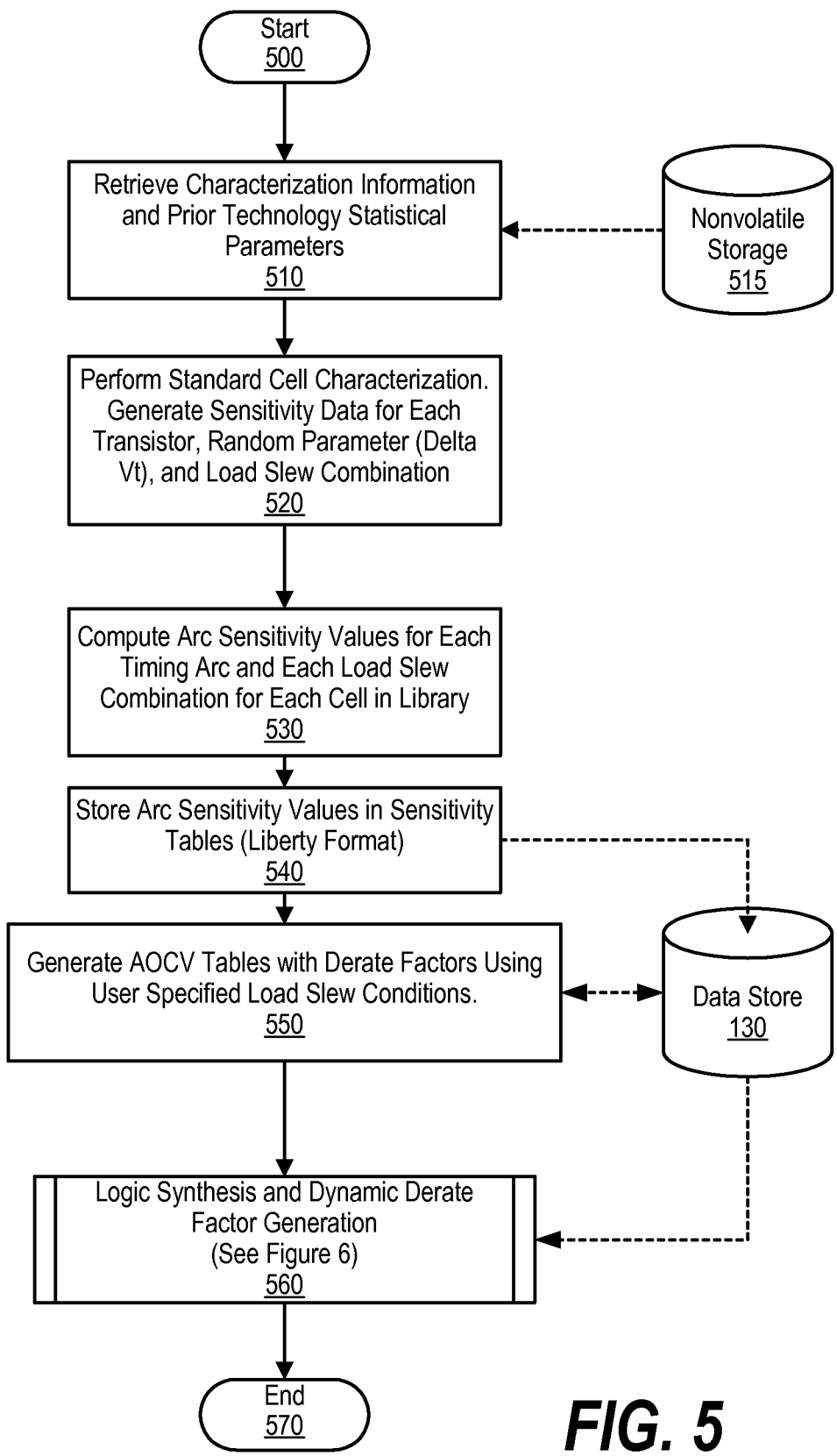
FIG. 5 is a high-level flowchart showing steps taken in characterizing a standard cell library and generating AOCV derate factors from sensitivity data collected during the standard cell characterization.

FIG. 5 is a flowchart showing steps taken in characterizing a standard cell library and generating AOCV derate factors from sensitivity data collected during the standard cell characterization.

Processing commences at 500 (e.g., characterization module 100), whereupon processing retrieves characterization information and technology-specific statistical parameters from nonvolatile storage 515 at step 510. In one embodiment, the characterization information includes SPICE model information and netlist information pertaining to a current semiconductor process technology and cell library. The technology-specific statistical parameters, as discussed above, include a particular (prior) semiconductor manufacturing technology's random variation parameters (on-chip variations).

Next, at step 520, processing characterizes each of the standard cells included in the cell library. Sensitivity data is generated for each transistor, random parameter (e.g., voltage threshold Vt), and load-slew combination. FIG. 2 shows an illustration of the sensitivity data collected during characterization (sensitivity data 210), which shows that data is collected for each timing arc (arc 1-arc m), for each random parameter (P1-Pn), and for each load-slew combination (load-slew 1 215-load-slew x 220).

At step 530, processing computes arc sensitivity values for each timing arc and each load-slew combination for each cell in the cell library. Next, processing stores the arc sensitivity values (e.g., in a liberty timing file format) in data store 130 (step 540). As those skilled in the art can appreciate, a liberty timing file (.lib) is an ASCII representation of timing and power parameters associated with a cell in a particular semiconductor manufacturing technology. A .lib file may include timing models and data to calculate I/O delay paths, timing check values, and interconnect delays. FIG. 3 shows an illustration of sensitivity table 135, which includes input slew conditions, output load conditions, and arc sensitivity values for each of the various load-slew combinations for a rising arc corresponding to a particular standard cell.

Processing (e.g., derate factor generation module 140) generates advanced on-chip variation (AOCV) derate factors (tables) from the sensitivity tables at step 550 that are based upon user-specified default load-slew combinations. For example, the user may specify a default input slew value and output load condition for a particular integrated circuit. FIG. 4 shows AOCV table 145, which includes derate factors for depths from 1-10 for rising/falling arcs of particular standard cells.

Testing module 160 uses the AOCV derate factors during static timing analysis. When logic synthesis encounters a timing violation, processing (e.g., derate factor generation module 140) creates custom derate factors based upon a specific load-slew combination of a cell instance (pre-defined process block 560, see FIG. 6 and corresponding text for further details). Processing ends at 570.

FIG. 6 is a flowchart showing steps taken in dynamically generating custom derate factors during logic synthesis. Processing commences at 600, whereupon processing retrieves an integrated circuit file from design store 170, and retrieves AOCV table 145 from data store 130 (step 610). At step 620, processing invokes logic synthesis and, at step 630, processing performs static timing analysis (e.g., via testing module 160 shown in FIG. 1).

A determination is made as to whether the static timing analysis generated a timing violation (decision 640). For example, the static timing analysis may have identified race conditions between two timing paths. If the static timing analysis generates a timing violation, decision 640 branches to the "Yes" branch, whereupon processing identifies the cell instance corresponding to the timing violation (e.g., instance of a NAND gate) and identifies its custom load-slew combination, which is the actual input slew and output load experienced by the particular cell instance (step 650).

Processing, at step 660, retrieves arc sensitivity values 230 from data store 130 that correspond to the custom load-slew combination of the cell instance. Processing computes custom derate factors based on arc sensitivity values 230 at step 670, which are utilized to simulate the specific cell instance in a subsequent static timing analysis (step 630). In one embodiment, an integrated circuit may include multiple instances of a particular standard cell (e.g., NAND gate) and, in this embodiment, processing may use default derate factors to simulate some of the cell instances and use custom derate factors to simulate other cell instances.

Processing continues synthesis and static timing analysis until there are no more timing violations, at which point decision 640 branches to the "No" branch, whereupon processing returns at 680. In one embodiment, many design characteristics may change during the above discussed iterations, such as output load conditions, input slew conditions, and or cell types used in the design, By customizing derate factors as discussed herein, the design iterations converge faster and produce a higher yielding integrated circuit due to their increased real-life accuracy.

FIG. 7 is a table showing an example of average, minimum, and maximum derate factor percentages for various buffers based upon load and slew conditions. Table 700 includes columns 710-790. Column 710 includes names of different buffers with different sizes, with example BUFF 1 corresponding to the smallest size and example BUFF 5 corresponding to the largest size. Columns 720 and 730 include delay variation percentages of rising arcs and failing arcs, respectively, as an average across several load/slew conditions.

Columns 740 and 750 show the range of the delay variation (from minimum to maximum variation) for rising and falling arcs respectively. The range in delay variation illustrates that across different slew/load conditions, the delay variation can differ by as much as 7.751% for rising arcs in example BUFF 1. The range of on-chip variation is large for smaller cells (example BUFF 1) because transistor variation has an inverse relation to transistor area. In turn, smaller transistors show increased transistor variation compared to wider transistors. Such a large range cannot be correctly represented utilizing a single AOCV derate factor. Thus, a cell's specific slew/load condition and delay variation is considered when generating customized derate factors.

Columns 760 and 770 show maximum delay variations across different slew/load conditions for rising/falling arcs, whereas columns 780 and 790 show minimum delay variations across different slew/load conditions for rising/falling arcs.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, a software embodiment (including firmware, resident software, micro-code, etc.), including processing circuitry for executing thereof, or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program, in a non-transitory fashion, for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
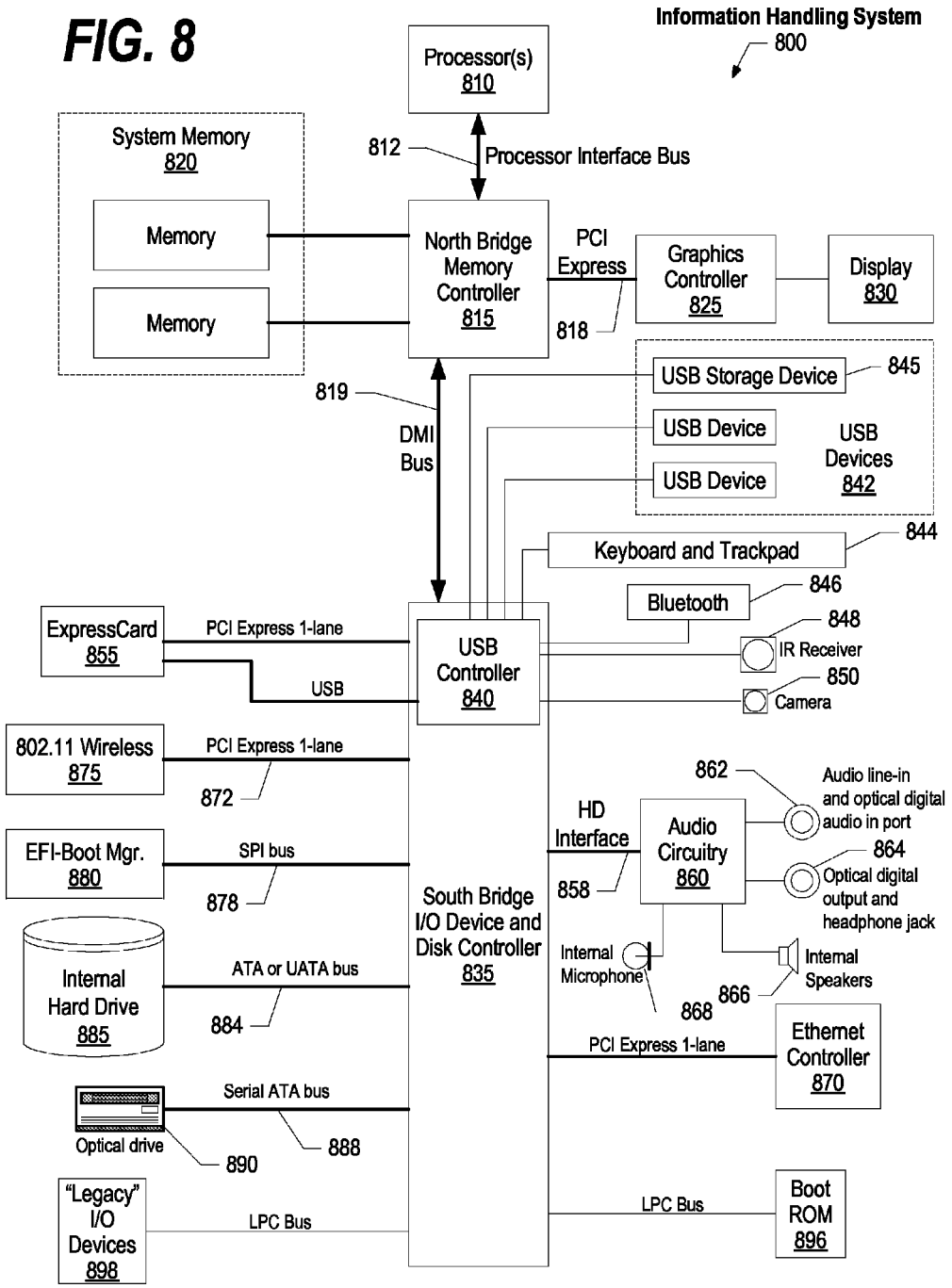
FIG. 8 is a block diagram of a data processing system in which the methods described herein can be implemented.

FIG. 8 illustrates information handling system 800, which is a simplified example of a computer system capable of performing the computing operations described herein. Information handling system 800 includes one or more processors 810 coupled to processor interface bus 812. Processor interface bus 812 connects processors 810 to Northbridge 815, which is also known as the Memory Controller Hub (MCH).

Northbridge 815 connects to system memory 820 and provides a means for processor(s) 810 to access the system memory. Graphics controller 825 also connects to Northbridge 815. In one embodiment, PCI Express bus 818 connects Northbridge 815 to graphics controller 825. Graphics controller 825 connects to display device 830, such as a computer monitor.

Northbridge 815 and Southbridge 835 connect to each other using bus 819. In one embodiment, the bus is a Direct Media Interface (DMI) bus that transfers data at high speeds in each direction between Northbridge 815 and Southbridge 835. In another embodiment, a Peripheral Component Interconnect (PCI) bus connects the Northbridge and the Southbridge. Southbridge 835, also known as the I/O Controller Hub (ICH) is a chip that generally implements capabilities that operate at slower speeds than the capabilities provided by the Northbridge. Southbridge 835 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 896 and "legacy" I/O devices (using a "super I/O" chip). The "legacy" I/O devices (898) can include, for example, serial and parallel ports, keyboard, mouse, and/or a floppy disk controller. The LPC bus also connects Southbridge 835 to Trusted Platform Module (TPM) 895. Other components often included in Southbridge 835 include a Direct Memory Access (DMA) controller, a Programmable Interrupt Controller (PIC), and a storage device controller, which connects Southbridge 835 to nonvolatile storage device 885, such as a hard disk drive, using bus 884.

ExpressCard 855 is a slot that connects hot-pluggable devices to the information handling system. ExpressCard 855 supports both PCI Express and USB connectivity as it connects to Southbridge 835 using both the Universal Serial Bus (USB) the PCI Express bus. Southbridge 835 includes USB Controller 840 that provides USB connectivity to devices that connect to the USB. These devices include webcam (camera) 850, infrared (IR) receiver 848, keyboard and trackpad 844, and Bluetooth device 846, which provides for wireless personal area networks (PANs). USB Controller 840 also provides USB connectivity to other miscellaneous USB connected devices 842, such as a mouse, removable nonvolatile storage device 845, modems, network cards, ISDN connectors, fax, printers, USB hubs, and many other types of USB connected devices. While removable nonvolatile storage device 845 is shown as a USB-connected device, removable nonvolatile storage device 845 could be connected using a different interface, such as a Firewire interface, etcetera.

Wireless Local Area Network (LAN) device 875 connects to Southbridge 835 via the PCI or PCI Express bus 872. LAN device 875 typically implements one of the IEEE 802.11 standards of over-the-air modulation techniques that all use the same protocol to wireless communicate between information handling system 800 and another computer system or device. Optical storage device 890 connects to Southbridge 835 using Serial ATA (SATA) bus 888. Serial ATA adapters and devices communicate over a high-speed serial link. The Serial ATA bus also connects Southbridge 835 to other forms of storage devices, such as hard disk drives. Audio circuitry 860, such as a sound card, connects to Southbridge 835 via bus 858. Audio circuitry 860 also provides functionality such as audio line-in and optical digital audio in port 862, optical digital output and headphone jack 864, internal speakers 866, and internal microphone 868. Ethernet controller 870 connects to Southbridge 835 using a bus, such as the PCI or PCI Express bus. Ethernet controller 870 connects information handling system 800 to a computer network, such as a Local Area Network (LAN), the Internet, and other public and private computer networks.

While FIG. 8 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method comprising:
   executing, by one or more processors, transistor-level circuit simulation of a standard cell included in a cell library, wherein the standard cell includes one or more parameters corresponding to a semiconductor manufacturing technology process;
   collecting, by one or more of the processors, sensitivity data that quantifies one or more changes to one or more performance metrics corresponding to the standard cell in response to adjusting one or more of the parameters during the transistor-level circuit simulation;
   generating, by one or more of the processors, one or more derate factors based upon the sensitivity data;
   retrieving, from a storage area by one or more of the processors, an integrated circuit design that includes one or more cell instances of the standard cell; and
   testing the integrated circuit design utilizing the one or more derate factors, wherein the testing comprises a static timing analysis of the integrated circuit design.

2. The method of claim 1 further comprising:
   creating, from the sensitivity data, one or more sensitivity tables that correspond to the standard cell, wherein each of the one or more sensitivity tables correspond to one or more timing arcs and a plurality of load-slew combinations.

3. The method of claim 2 wherein the static timing analysis simulates operation, utilizing one or more of the sensitivity tables, of an integrated circuit built from the integrated circuit design using the semiconductor manufacturing technology process.

4. The method of claim 3 further comprising:
retrieving a first set of arc sensitivity values from the one or more sensitivity tables corresponding to a first one of the plurality of load-slew combinations;
creating an advanced on-chip variation (AOCV) table based upon the retrieved first set of arc sensitivity values, wherein the AOCV table includes one or more first derate factors computed from the first set of arc sensitivity values; and
simulating a first instance of the standard cell included in the integrated circuit design utilizing one or more of the first derate factors during the static timing analysis.

5. The method of claim 4 wherein the integrated circuit design includes a second instance of the standard cell, the method further comprising:
utilizing, during the static timing analysis, one or more of the first derate factors to simulate the second instance of the standard cell included in the integrated circuit design;
detecting a timing violation at the second instance of the standard cell;
retrieving a second set of arc sensitivity values from the one or more sensitivity tables, wherein the second set of arc sensitivity tables corresponds to a second one of the plurality of load-slew combinations that is different than the first load-slew combination;
determining one or more second derate factors based upon the second set of arc sensitivity values; and
utilizing one or more of the second derate factors to simulate the second instance of the standard cell during a subsequent static timing analysis of the integrated circuit design.

6. The method of claim 5 wherein the subsequent static timing analysis utilizes one or more of the first derate factors to simulate the first instance of the standard cell concurrently with utilizing one or more of the second derate factors to simulate the second instance of the standard cell.

7. The method of claim 5 further comprising:
analyzing the timing violation during the simulation;
identifying an actual load-slew combination of the second instance of the standard cell, wherein the actual load-slew combination includes an output load and an input slew of the second instance of the standard cell;
comparing the actual load-slew combination with the plurality of load-slew combinations; and
selecting the second load-slew combination in response to the comparison.

8. The method of claim 1 further comprising:
retrieving technology-specific statistical parameters from a storage area, wherein the technology-specific statistical parameters correspond to a different semiconductor manufacturing technology process; and
utilizing the technology-specific statistical parameters during the transistor-level circuit simulation to generate the sensitivity data.

9. An information handling system comprising:
one or more processors;
one or more memories accessible by at least one of the processors;
a characterization module executing on one of the processors that executes transistor-level circuit simulation of a standard cell included in a cell library, wherein the standard cell includes one or more parameters corresponding to a semiconductor manufacturing technology process;
collection logic included in the characterization module that collects sensitivity data, wherein the sensitivity data quantifies one or more changes to one or more performance metrics corresponding to the standard cell in response to adjusting one or more of the parameters during the transistor-level circuit simulation;
a derate factor generation module executing on one of the processors that generates one or more derate factors based upon the sensitivity data; and
a testing module executing on one of the processors that retrieves an integrated circuit design from one of the memories and tests the integrated circuit design utilizing the one or more derate factors, wherein the integrated circuit design includes one or more cell instances of the standard cell, and wherein the testing comprises a static timing analysis of the integrated circuit design.

10. The information handling system of claim 9 further comprising:
sensitivity table generation logic included in the characterization module that creates, from the sensitivity data, one or more sensitivity tables that correspond to the standard cell, wherein each of the one or more sensitivity tables correspond to one or more timing arcs and a plurality of load-slew combinations.

11. The information handling system of claim 10 wherein the static timing analysis simulates operation, utilizing one or more of the sensitivity tables, of an integrated circuit built from the integrated circuit design using the semiconductor manufacturing technology process.

12. The information handling system of claim 11 further comprising:
retrieval logic included in the derate factor generation module that retrieves a first set of arc sensitivity values from the one or more sensitivity tables corresponding to a first one of the plurality of load-slew combinations;
advanced on-chip variation (AOCV) table creation logic included in the derate factor generation module that creates an AOCV table based upon the retrieved first set of arc sensitivity values, wherein the AOCV table includes one or more first derate factors computed from the first set of arc sensitivity values; and
wherein the testing module utilizes, during the static timing analysis, one or more of the first derate factors to simulate a first instance of the standard cell included in the integrated circuit design.

13. The information handling system of claim 12 wherein the integrated circuit design includes a second instance of the standard cell, the information handling system further comprising:
utilization logic included in the testing module that utilizes, during the static timing analysis, one or more of the first derate factors to simulate the second instance of the standard cell included in the integrated circuit design;
detection logic included in the testing module that detects a timing violation at the second instance of the standard cell;
the retrieval logic that retrieves a second set of arc sensitivity values from the one or more sensitivity tables, wherein the second set of arc sensitivity tables corresponds to a second one of the plurality of load-slew combinations that is different than the first load-slew combination;

determination logic included in the derate factor generation module that determines one or more second derate factors based upon the second set of arc sensitivity values; and the utilization logic that utilizes one or more of the second derate factors to simulate the second instance of the standard cell during a subsequent static timing analysis of the integrated circuit design.

14. The information handling system of claim 13 wherein the subsequent static timing analysis utilizes one or more of the first derate factors to simulate the first instance of the standard cell concurrently with utilizing one or more of the second derate factors to simulate the second instance of the standard cell.

15. The information handling system of claim 13 further comprising:

analysis logic included in the testing module that analyzes the timing violation during the static timing analysis;

identification logic included in the testing module that identifies an actual load-slew combination of the second instance of the standard cell, wherein the actual load-slew combination includes an output load and an input slew of the second instance of the standard cell;

comparison logic included in the derate factor generation module that compares the actual load-slew combination with the plurality of load-slew combinations; and selection logic included in the derate factor generation module that selects the second load-slew combination in response to the comparison.

16. A computer program product stored in a computer readable storage medium, comprising computer program code that, when executed by an information handling system, causes the information handling system to perform actions comprising:

executing transistor-level circuit simulation of a standard cell included in a cell library, wherein the standard cell includes one or more parameters corresponding to a semiconductor manufacturing technology process;

collecting sensitivity data that quantifies one or more changes to one or more performance metrics corresponding to the standard cell in response to adjusting one or more of the parameters during the transistor-level circuit simulation;

generating one or more derate factors based upon the sensitivity data;

retrieving, from a storage area, an integrated circuit design that includes one or more cell instances of the standard cell; and testing the integrated circuit design utilizing the one or more derate factors, wherein the testing comprises a static timing analysis of the integrated circuit design.

17. The computer program product of claim 16 wherein the computer readable storage medium stores additional instructions that, when executed by the information handling system, cause the information handling system to perform additional actions comprising:

creating, from the sensitivity data, one or more sensitivity tables that correspond to the standard cell, wherein each of the one or more sensitivity tables correspond to one or more timing arcs and a plurality of load-slew combinations.

18. The computer program product of claim 17 wherein the static timing analysis simulates operation, utilizing one or more of the sensitivity tables, of an integrated circuit built from the integrated circuit design using the semiconductor manufacturing technology process.

19. The computer program product of claim 18 wherein the computer readable storage medium stores additional instructions that, when executed by the information handling system, cause the information handling system to perform additional actions comprising:

retrieving a first set of arc sensitivity values from the one or more sensitivity tables corresponding to a first one of the plurality of load-slew combinations;

creating an advanced on-chip variation (AOCV) table based upon the retrieved first set of arc sensitivity values, wherein the AOCV table includes one or more first derate factors computed from the first set of arc sensitivity values; and simulating a first instance of the standard cell included in the integrated circuit design utilizing one or more of the first derate factors during the static timing analysis.

20. The computer program product of claim 19 wherein the integrated circuit design includes a second instance of the standard cell, and wherein the computer readable storage medium stores additional instructions that, when executed by the information handling system, cause the information handling system to perform additional actions comprising:

utilizing, during the static timing analysis, one or more of the first derate factors to simulate the second instance of the standard cell included in the integrated circuit design;

detecting a timing violation at the second instance of the standard cell;

retrieving a second set of arc sensitivity values from the one or more sensitivity tables, wherein the second set of arc sensitivity tables corresponds to a second one of the plurality of load-slew combinations that is different than the first load-slew combination;

determining one or more second derate factors based upon the second set of arc sensitivity values; and utilizing one or more of the second derate factors to simulate the second instance of the standard cell during a subsequent static timing analysis of the integrated circuit design.

* * * * *